United States Patent [19]
Smith

[11] Patent Number: 5,737,348
[45] Date of Patent: Apr. 7, 1998

[54] LIGHT SOURCE MONITOR WITH COMPENSATED TRACKING RATIO

[75] Inventor: David F. Smith, Dallas, Tex.

[73] Assignee: Honeywell Inc., Minneapolis, Minn.

[21] Appl. No.: 739,471

[22] Filed: Oct. 28, 1996

[51] Int. Cl.$^6$ ........................................ H01S 3/10
[52] U.S. Cl. ................................. 372/31; 257/80
[58] Field of Search .................... 372/29, 31, 108, 372/109; 257/80, 81, 82

[56] References Cited

U.S. PATENT DOCUMENTS

| | | | |
|---|---|---|---|
| 5,608,233 | 3/1997 | Sahara et al. | 372/102 |
| 5,663,944 | 9/1997 | Onun | 372/102 |

*Primary Examiner*—James W. Davie
*Attorney, Agent, or Firm*—William D. Lanyi

[57] ABSTRACT

A laser monitor is provided with a light sensitive component disposed near the laser and spaced apart from two windows that are generally parallel to each other. The two windows are located at positions which provide compensating reflective light beams whose power reflected back onto the light sensitive component combine to provide a relatively constant sum over a finite range of magnitudes of divergences of the laser beam. The nearest window to the light sensitive component reflects a light beam with a generally circular illuminated region having a smaller diameter than the diameter of the light sensitive component. The farther window reflects a light beam onto the light sensitive component with a diameter that is larger than the light sensitive component. As the numerical aperture of the laser increases, both illuminated circles increase in diameter and the increase in one reflected beam compensates the decrease in the other reflected beam so that the sum of the two powers falling on the detector is generally constant over the preselected range of numerical apertures. This provides a relatively constant tracking ratio that enables the light sensitive component to serve as a reliable monitor of the emitted power from the laser, which can be a VCSEL.

13 Claims, 7 Drawing Sheets

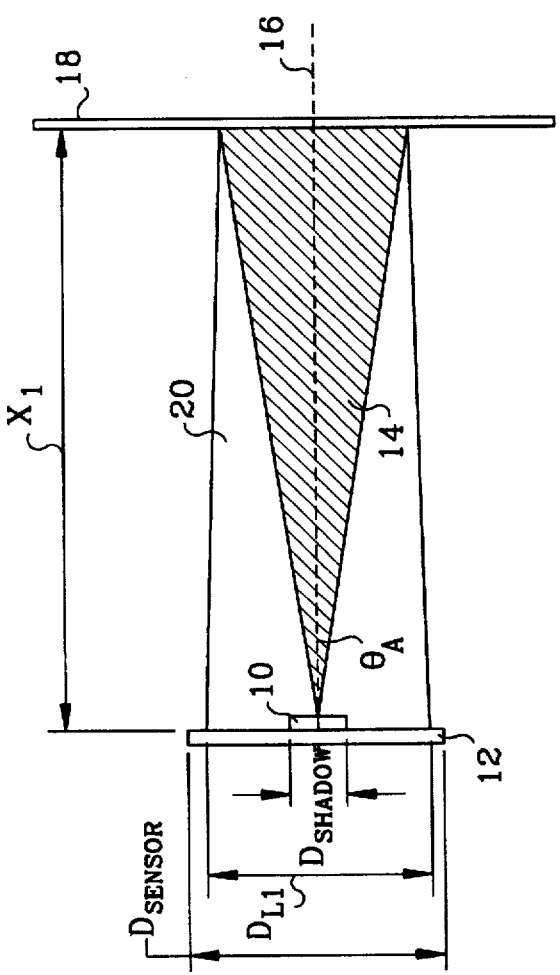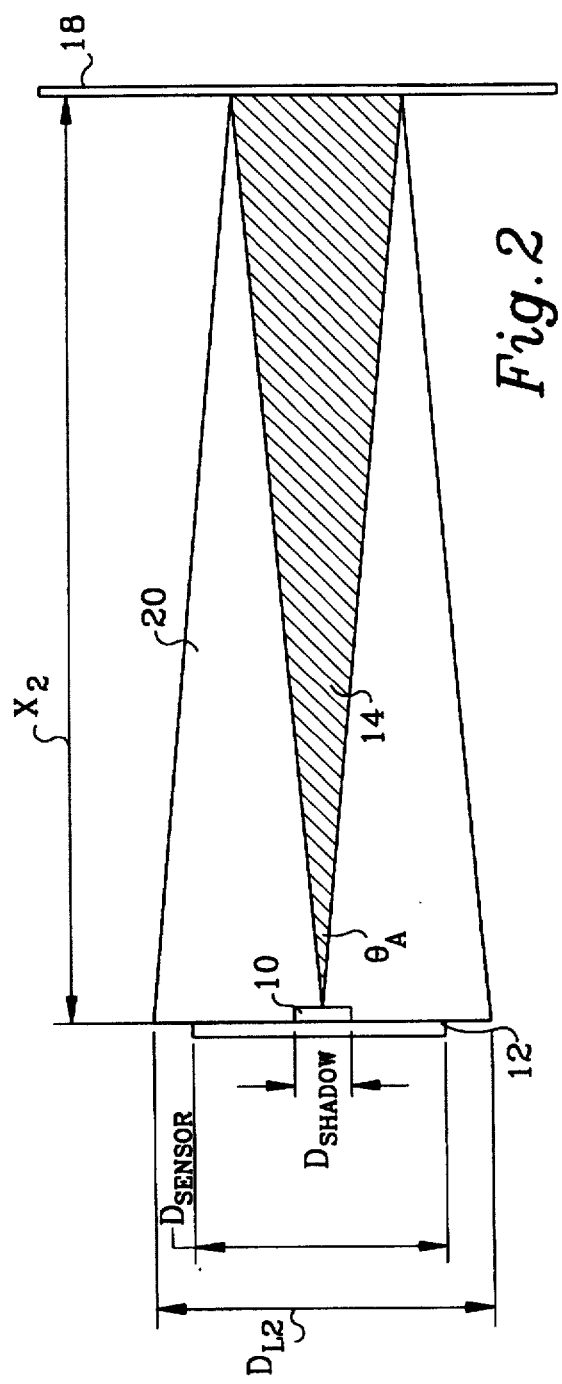

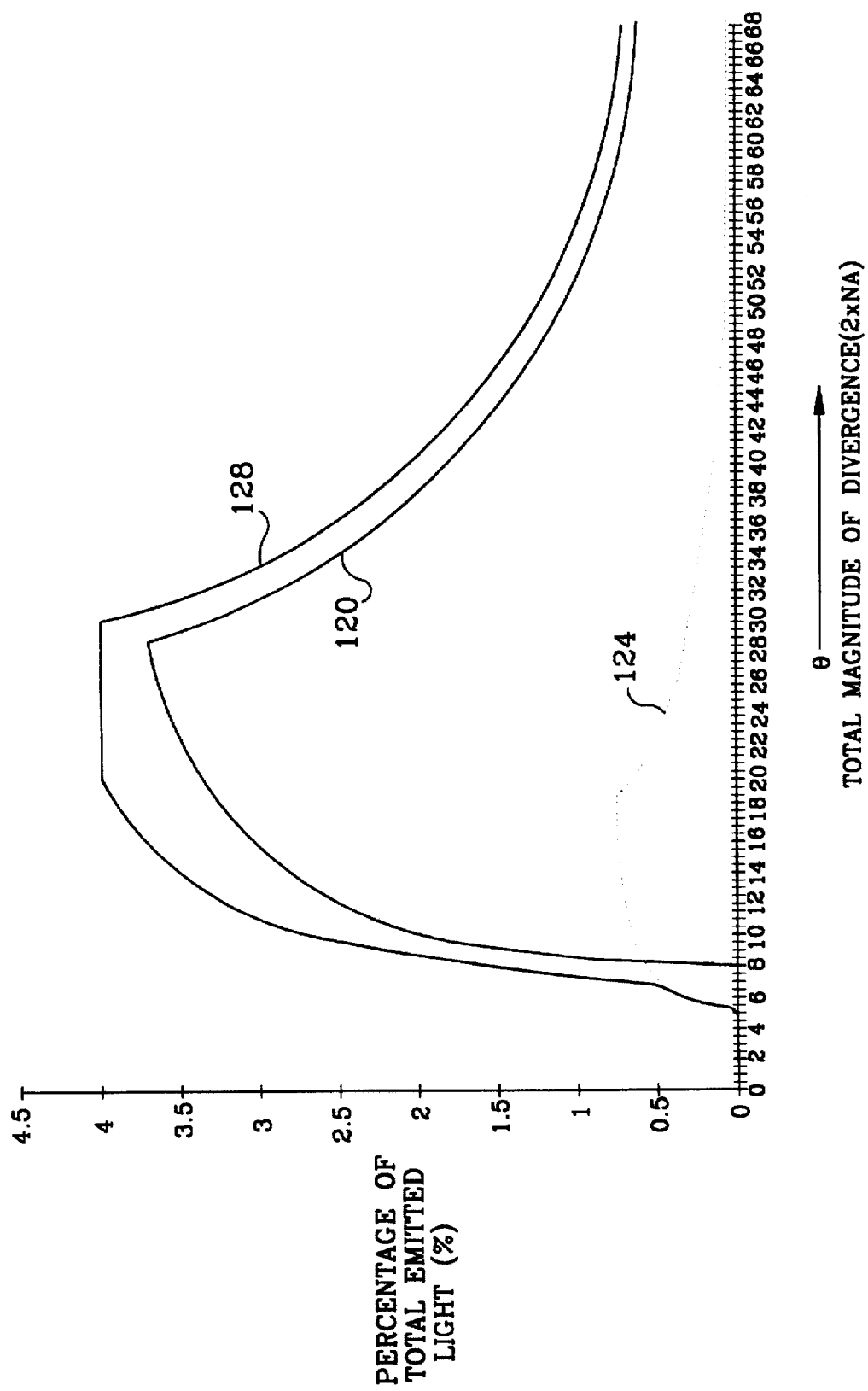

LIGHT SOURCE MONITOR WITH COMPENSATED TRACKING RATIO

BACKGROUND OF THE INVENTION

1. Field of the Invention

The present invention is generally related to a light monitor with a compensated tracking ratio arrangement and, more particularly, to a configuration of a laser and a photodetector in a combination with two windows which are spaced apart by an appropriate distance to cause dual reflections, which are compensating to each other, to fall on the photodetector.

2. Description of the Prior Art

In certain applications of light sources, such as lasers, it is necessary to provide some way to monitor the intensity of light emitted by the light source. One possible scheme for satisfying this requirement is to provide a light sensitive component, such as a photodiode, in combination with the light source and arrange the light source and light sensitive component in a configuration that allows the light sensitive component to receive a preselected portion of the total light output from the light source. As an example, in conventional semiconductor laser structures, where light is emitted in a wide range of directions, a light sensitive component can be disposed within a common housing with the laser so that it receives a portion of the light from the laser. In this way, the light sensitive component can monitor the output of the laser ratiometrically.

Since vertical cavity surface emitting lasers (VCSEL's) emit light in one direction from an upper surface of the laser, known methods of monitoring the output of the laser are not easily adaptable to VCSEL's. One possible way of monitoring the output energy of a VCSEL is described in U.S. patent application Ser. No. 08/686,895 which was filed on Jul. 26, 1996 by Cox (H16-16625), commonly assigned. In that patent application, a lens is described for a semiconductor device with a laser and a photodetector in a common container. The laser and photodetector are combined in a common package in order to permit the photodetector to monitor the light intensity emitted by the laser. The laser and photodetector can be produced monolithically on a common chip to improve the necessary accuracy of positioning of the various components. The device can be disposed within a common container having a window through which the emitted light passes. The window is configured to have inside and outside surfaces that selectively reflect a portion of the light back to the photodetector while transmitting the remaining portion of the light through the window through a phototransmissive device, such as an optical fiber. The light reflected back to the photodetector can be focused in a predetermined pattern to cause the light to be accurately received by the photodetector and not fall on the laser itself.

When light from a laser is reflected back toward a photodetector, the ratio of the detected light to the total emitted light must conform to an expected proportion in order for the reflected light to be an accurate indicator of the total emitted light energy. For example, if the photodetector always receives approximately twenty percent of the emitted light energy, the detector can serve as a reliable monitor of the laser output. However, if this ratio fluctuates during operation of the laser, the method becomes an unreliable technique for monitoring the laser's output energy.

Unfortunately, VCSEL's can be affected by certain operating conditions, such as temperature, which can affect certain variable characteristics of the VCSEL. One of these variable characteristics is the numerical aperture NA which refers to the half angle of the laser beam's magnitude of divergence. As the angle of divergence of the light beam changes, the amount of reflected energy that is received by the monitor photodiode may also change. If the amount of light received by the monitoring photodiode changes, because of some variable characteristic of the laser, even though the total power output from the laser remains constant, the usefulness of the monitoring photodiode is severely diminished. It would therefore be significantly beneficial if some means could be provided to assure that the monitoring photodiode receives a relatively constant percentage of the VCSEL's output regardless of changes in the variable characteristics of the laser. Even if this constancy of the reflected percentage is not absolutely consistent over all possible values of the variable characteristic, it would be beneficial if the percentage of reflected light is relatively constant over a predetermined range of the variable characteristic within which the VCSEL is expected to operate under normal conditions.

SUMMARY OF THE INVENTION

The present invention provides a monitoring system for a VCSEL in which the total light energy reflected by a pair of windows onto a light sensitive component remains relatively constant over a preselected range of numerical apertures or magnitudes of divergence of the light beam emitted by the laser. In a preferred embodiment of the present invention, it comprises a light source for providing a light beam. It also comprises a light sensitive component that is disposed proximate the light source. A first window, which intersects an axis through the light source, is partially reflective and partially transmissive and is disposed to direct a first reflected light beam toward the light sensitive component. The amount of light energy of the first reflected light beam that is directed onto the light sensitive component by the first window is a function of a variable characteristic of the light beam, such as the numerical aperture or magnitude of divergence. The present invention also comprises a second window which intersects the axis that extends through the light source. The second window is also partially reflective and partially transmissive and is disposed to direct a second reflected light beam toward the light sensitive component. The amount of light energy of the second reflected light beam directed onto the light sensitive component by the second window is also a function of the variable characteristic of the light beam, such as its numerical aperture or magnitude of divergence. The first and second windows are spaced apart from each other by a predetermined distance. As a result of this structure, a change in the variable characteristic of the light beam causes mutually compensating changes in the first and second reflected light beams to cause a sum of the light energies of the first and second reflected light beams directed onto the light sensitive component to remain generally constant over a preselected range of the variable characteristic.

In a particularly preferred embodiment of the present invention, the light source is a laser of the type known as a vertical cavity surface emitting laser, or VCSEL. In addition, a particularly preferred embodiment of the present invention places the VCSEL at a location where it is surrounded by a light sensitive component. This can be done by integrating the VCSEL and the light sensitive component on a single chip with the VCSEL being placed at a central region of the light sensitive component, such as a photodiode. In alternative embodiments, the light sensitive component and the VCSEL can be placed side-by-side on a common substrate.

Although a preferred embodiment of the present invention disposes the first and second windows in generally perpendicular association with the common axis that extends from the light source, it should be understood that this perpendicularity is not a requirement in all embodiments. In addition, although a preferred embodiment of the present invention places the first and second windows in generally parallel association with each other, this parallelism is not a requirement in all embodiments. The present invention can be used to accommodate a variable characteristic of the laser. A preferred embodiment of the present invention is directed toward a goal of compensating the variability of the numerical aperture NA of the laser, or its magnitude of divergence of the light beam, but it should be understood that not all embodiments of the present invention need to be directed toward this goal.

BRIEF DESCRIPTION OF THE DRAWINGS

The present invention will be more fully and completely understood from a reading of the Description of the Preferred Embodiment in conjunction with the drawings, in which:

FIGS. 1 and 2 show schematic side views of a VCSEL, a light sensitive component, and a window for the purpose of showing the effect of increases in the spacing between the light sensitive component and the window;

FIGS. 11 and 12 show the graphical representation of the reflected light beams from two windows under two specified sets of conditions.

DESCRIPTION OF THE PREFERRED EMBODIMENT

Figure 3:
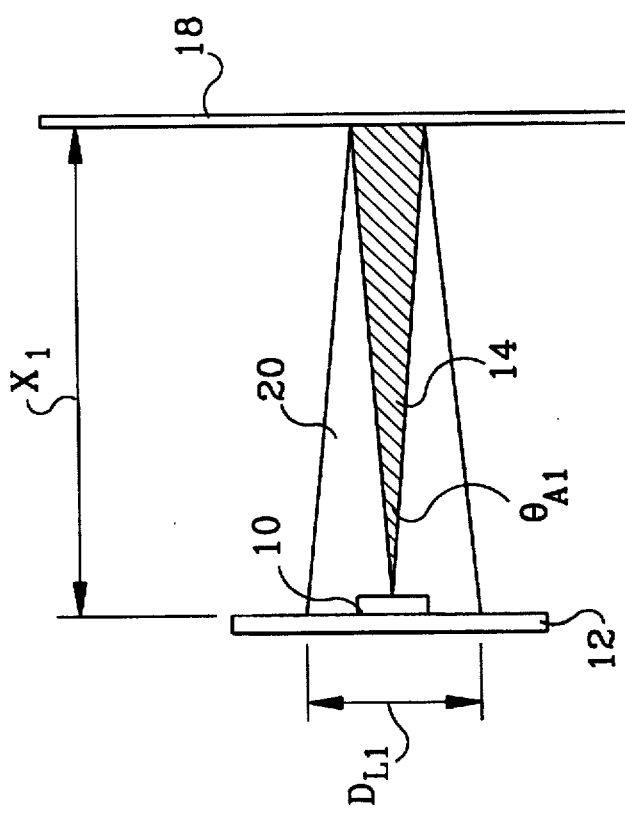
FIGS. 3 and 4 show the effect of changes in the numerical aperture or magnitude of divergence of the VCSEL light beam.

Throughout the Description of the Preferred Embodiment, like components will be identified by like reference numerals. It should also be understood that the description of the present invention will be provided in conjunction with the Figures which are simplified schematics. Furthermore, certain assumptions have been made in order to allow the present invention to be described more clearly without the undue complications that would otherwise result from certain alternative assumptions concerning the uniformity of light distribution of the emitted light beam and reflected light beams and the preciseness of the circularity of the shapes of the light beams imposed on the windows and light sensitive components. For the purposes of this description, the light beam emitted by the laser is assumed to be consistently circular in cross section and of uniform light energy distribution throughout the light beam. One skilled in the art will realize that, although these assumptions are being made for the purposes of clarity of the description, laser beams often exhibit nonuniform circularity of their cross sections and nonuniformity of light energy distribution within the beam. These light energy distributions can be Gaussian or may exhibit multiple modal densities. These nonuniformities can be mathematically compensated by known techniques. From the following description, one skilled in the art will be able to adapt various embodiments of the present invention to particular applications which have particular nonuniform characteristics.

FIG. 1 illustrates a cross sectional view of a VCSEL 10 arranged in association with a light sensitive component 12. The VCSEL directs a light beam 14 along an axis 16. The illustration of FIG. 1 shows a window 18 spaced apart from the light sensitive component 12 by a distance identified as $X_1$. It should be understood that, although the VCSEL 10 and light sensitive component 12 are illustrated in the Figures as not being coplanar, in most applications the surfaces of the VCSEL 10 and light sensitive component 12 facing the window 18 are very close to being coplanar and, in some cases, are manufactured as coplanar elements on a common semiconductor substrate.

With continued reference to FIG. 1, it can be seen that the light beam 14 is emitted from the VCSEL 10 and exhibits a magnitude of divergence that is identified as $\Theta_A$. The magnitude of divergence $\Theta_A$ is sometimes identified by its numerical aperture NA magnitude which is equivalent to the half-angle of the divergence or one half of $\Theta_A$.

When the light beam 14 strikes the window 18, it is partially reflected and partially transmitted by the window. The reflected beam 20 passes in a direction toward the left in FIG. 1 and eventually strikes the light sensitive component 12. For purposes of the following discussion, certain dimensions in FIG. 1 are identified and will be used in the development of certain equations and relationships below. After the light beam 14 strikes the window 18 and is reflected back toward the light sensitive component 12, it strikes the light sensitive component and illuminates a circular pattern on the light sensitive component 12. The diameter of that illuminated circle is identified as $D_{L1}$. A generally circular laser 10 is centrally located on the light sensitive component 12 and has a diameter that is identified as $D_{SHADOW}$ because its presence on the light sensitive component 12 creates a shadow in the central region of the light sensitive component where light will not be detected by it. The diameter of the light sensitive component 12 is identified as $D_{SENSOR}$. If $\Theta_A$ is the total magnitude of the angle of divergence of the light beam 14, it can be shown geometrically that the radius $R_{L1}$ of the illuminated circle of light provided by the reflected light beam 20 on the light sensitive component 12 is defined as shown below in equation 1.

$$R_{L1} = 2(X_1)(\tan \Theta_A/2) \tag{1}$$

FIG. 2 is similar to FIG. 1, except with the dimension $X_2$ being increased. The angle of divergence is the same in FIGS. 1 and 2. The radius $R_{L2}$ of the illuminated circle of light on the light sensitive component 12 resulting from the reflected beam 14 would be defined as shown in equation 2.

$$R_{L2} = 2(X_2)(\tan (\Theta_A/2) \tag{2}$$

As a result, it can be seen that an increase from $X_1$ to $X_2$ causes a corresponding increase in the radius of the illuminated circle of light on the light sensitive component 12, even though all other dimensions remain the same. In FIG. 1, the illuminated circle of light is smaller than the sensor 12 while in FIG. 2 the illuminated circle of light is larger than the diameter of sensor 12.

Figure 4:
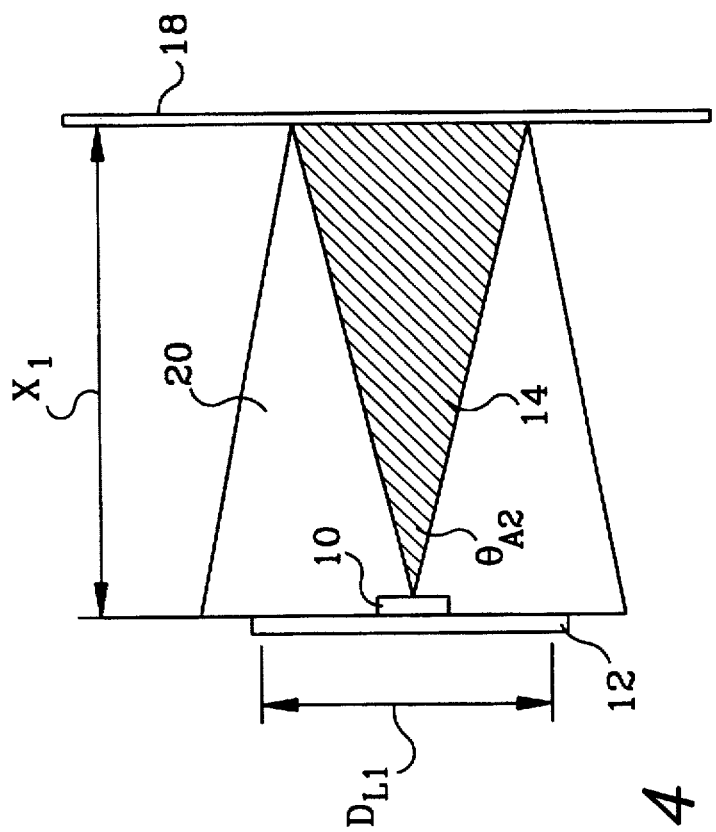

FIGS. 3 and 4 are provided to show that, with a constant distance $X_1$, an increase in the angle of divergence $\Theta_A$ can result in an increase in the diameter of the illuminated circle resulting from the reflected beam 14 striking the surface of the light sensitive component 12. In FIG. 3, the smaller angle of divergence $\Theta_{A1}$ will create a circle of light on the light sensitive component 12 with a diameter $D_{L1}$ which is smaller than the diameter of the sensor itself. However, as shown in FIG. 4, an increase in the angle of divergence to $\Theta_{A2}$ can create a reflected beam 14 which increases the diameter of the illuminated circle to a magnitude greater than the diameter of the sensor, or light sensitive component 12. FIGS. 3 and 4 illustrate one common problem in many VCSEL monitoring devices. As the angle of divergence of light beam 14 changes, the amount of light imposed on the light sensitive component 12 also changes. Since the VCSEL 10 casts a shadow over a portion of the light sensitive component 12, the total light energy imposed on the light sensitive component 12 in FIG. 4 is different than the total light energy imposed on the light sensitive component 12 in FIG. 3. This change occurs even though the total energy emitted by the laser 10 in light beam 14 remains constant. As a result, the ratio of the reflected light received by the light sensitive component 12 to the total light emitted by the laser changes as a result of the change in the angle of divergence of the light beam 14. Therefore, the positioning of the light sensitive component 12 with respect to the VCSEL and window as described above does not provide a monitoring configuration that is reliable.

Figure 8:
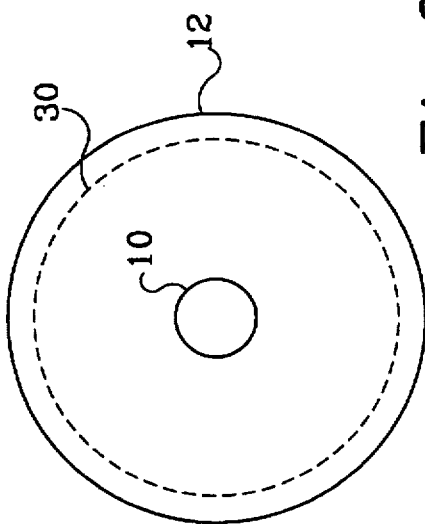
Figure 9:
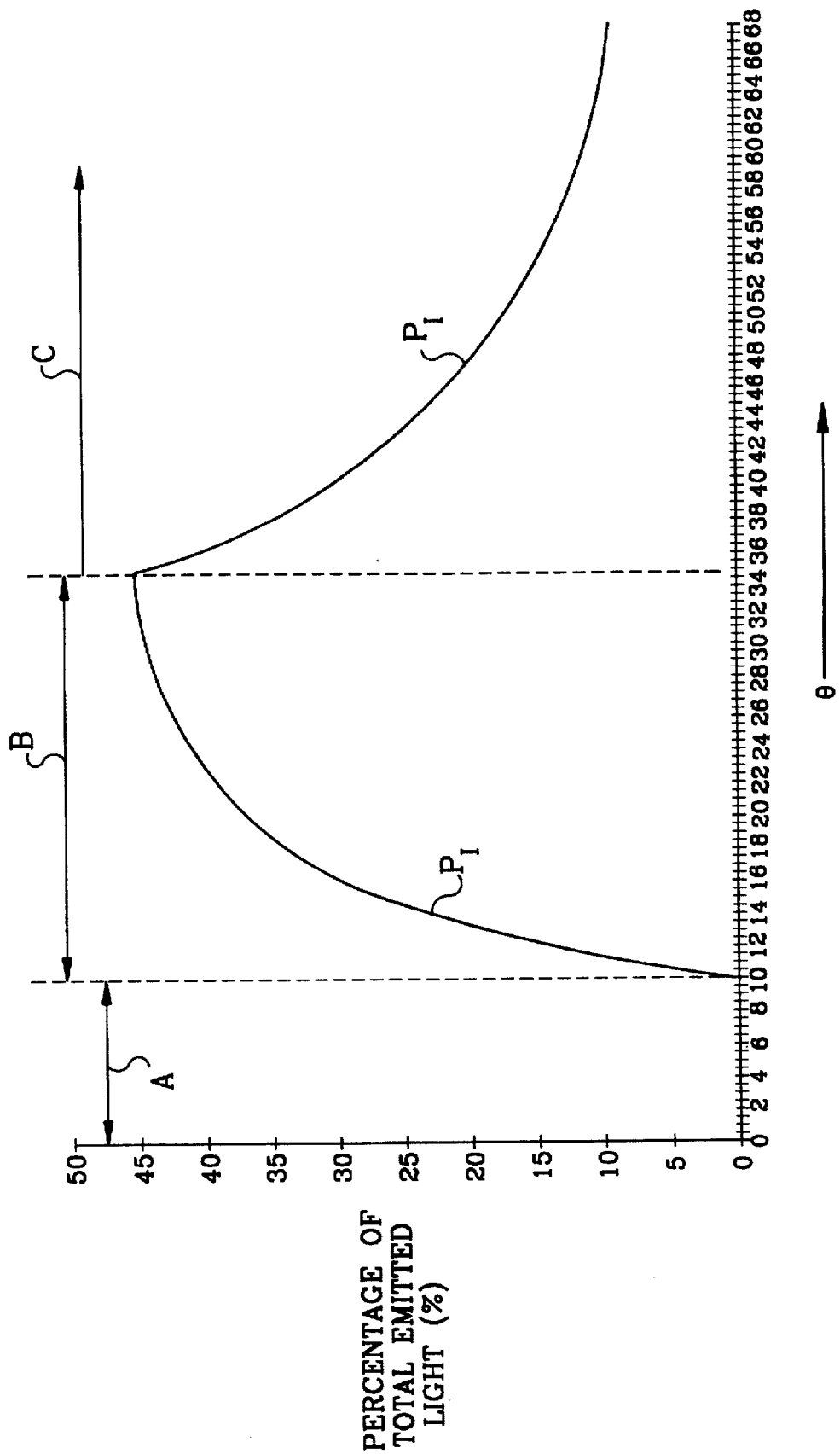
FIG. 9 shows the characteristic shape of the energy reflected back onto a light sensitive component by a window as a function of the numerical aperture of the light beam emitted by a laser.

The theory of operation of the present invention will be described in conjunction with FIGS. 5–9. FIGS. 5–8 illustrate various conditions where a circle of illumination 30 extends over various portions of a light sensitive component 12 with a VCSEL 10 disposed at a central region of the light sensitive component 12. FIG. 9 is a graphical representation showing the percentage of light energy emitted by a laser which is reflected back and received by the light sensitive component 12.

Figure 5:
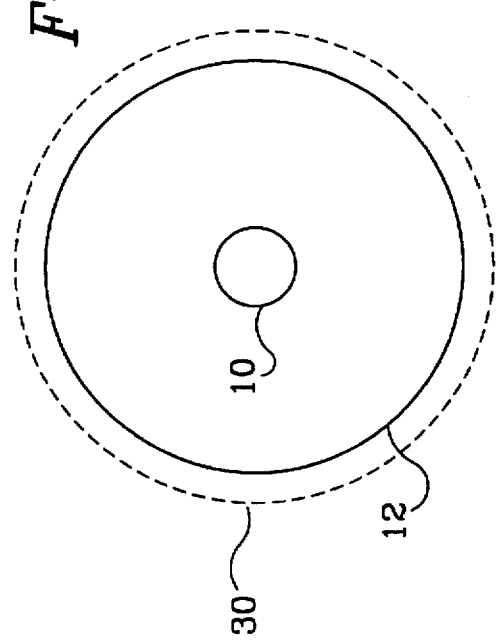
FIGS. 5, 6, 7 and 8 show relationships between the diameter of a VCSEL, the diameter of a light sensitive component and the varying diameters of an illuminated circle provided by a reflected laser beam.

FIG. 5 represents a condition where the diameter of the illuminated circle 30 is greater than the diameter of the shadow cast by the VCSEL 10, but smaller than the diameter of the sensor, or light sensitive component 12. The percentage of the total emitted light energy which is reflected by the window 18 and received by the light sensitive component 12 is described in equation 3.

$$P_I = (P_0)(C)((R_{LIGHT}^2 - R_{SHADOW}^2)/R_{LIGHT}^2) \qquad (3)$$

Figure 6:
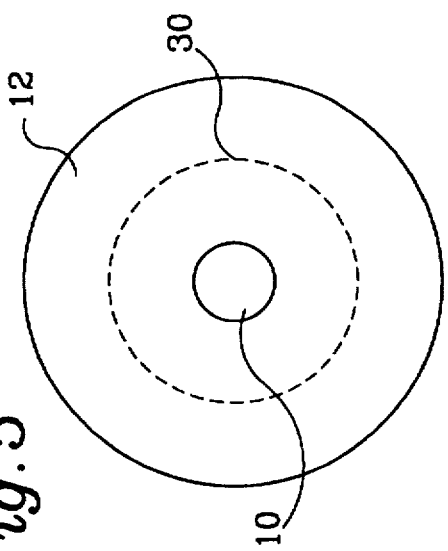

In equation 3, $P_I$ represents the power imposed on the light sensitive component 12 by the circle of illumination provided by the reflected beam 20 as a function of the total power $P_0$ emitted by the laser 10. In equation 3, the total power $P_0$ of the light emitted by the laser 10 is multiplied by a coefficient C that represents the reflectivity of the window 18. This result is also multiplied by the ratio of the quantity representing the area of the illuminated circle 30 minus the area of the shadow cast by the VCSEL 10, wherein this quantity is divided by the area of the illuminated circle 30. As the radius of the illuminated circle 30 increases, as shown in FIG. 6, the magnitude of the light energy imposed on the light sensitive component 12 also increases, as defined by equation 3 above. This is true for a circle of illumination with a diameter between the magnitudes of the diameter of the shadow of the VCSEL 10 and the diameter of the sensor 12.

In FIG. 9, the power received by the light sensitive component is graphically represented as a function of the angle of divergence $\Theta$. The graphical representation in FIG. 9 is divided into three sections along the horizontal axis. The first section A, where $\Theta$ is less than 10 degrees, represents a condition where the diameter of the illuminated circle 30 is less than the diameter of the VCSEL 10. Under these conditions, all of the reflected light is blocked from reaching the light sensitive component 12 by the shadow of the VCSEL. Therefore, the percentage of total emitted light reflected onto the light sensitive component 12 is zero. When the diameter of the illuminated circle 30 exceeds the diameter of the VCSEL 10, as represented in FIGS. 5 and 6, an increase in the angle of divergence $\Theta$ results in an increase in the amount of light imposed on the light sensitive surface of the light sensitive component 12. This portion of FIG. 9 is identified by arrow B. The portion of FIG. 9 identified by arrow A represents the condition described above where the VCSEL 10 totally blocks the light and prevents it from reaching the light sensitive component 12. Equation 3 describes the shape of the curve in FIG. 9 within the region identified by arrow B.

Equation 4 describes the percentage of light imposed on the light sensitive component when the diameter of the illuminated circle 30 exceeds the diameter of the light sensitive component 12. This condition is illustrated in FIGS. 7 and 8.

$$P_I = (P_0)(C)((R_{SENSOR}^2 - R_{SHADOW}^2)/R_{LIGHT}^2) \qquad (4)$$

Figure 7:
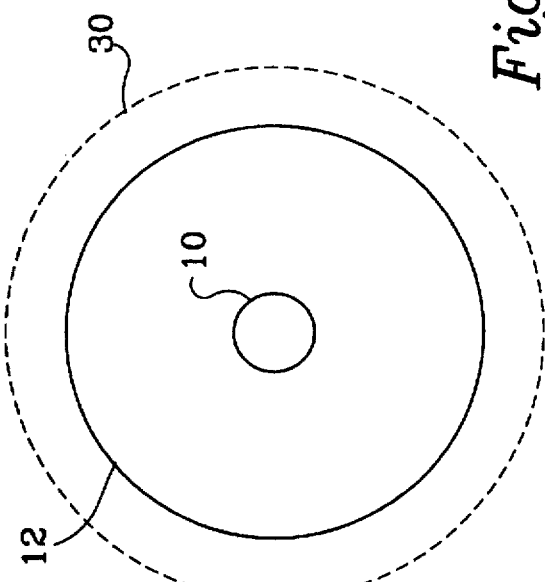

In FIG. 7, the diameter of the illuminated circle 30 is slightly greater than the diameter of the sensor. Therefore, some of the light energy reflected by the window 18 falls outside the surface of the sensor and is not sensed by the light sensitive component 12. The light power which can not be sensed by the light sensitive component 12 comprises the region of the illuminated circle 30 outside the diameter of the light sensitive component 12 and the region under the shadow cast by the VCSEL 10. FIG. 8 is generally similar to FIG. 7, but is intended to show an illuminated circle 30 with a diameter that is increased over that which is illustrated in FIG. 7. In FIG. 9, the percentage of total emitted light that falls on the light sensitive component 12 is illustrated in the portion of the graphical representation identified by arrow C. This part of the curve results from the relationship shown in equation 4.

With reference to FIG. 9, it can be seen that as the angle of divergence $\Theta$ increases from zero to a magnitude slightly less than the diameter of the VCSEL 10 in region A, no light is received by the light sensitive component 12. When the diameter of the illuminated circle 30 increases to a magnitude greater than the VCSEL 10, the light imposed on the light sensitive component 12 increases as a function of the angle of divergence $\Theta$. This relationship in region B is described in equation 3. When the diameter of the illuminated circle equals the diameter of the light sensitive component 12, the percentage of emitted light received by the light sensitive component 12 reaches its maximum. Any further increase in the diameter of the illuminated circle 30 will result in a condition illustrated as region C in FIG. 7 and represented by equation 4. This results in a continual decline in the percentage of total emitted light energy that is received by the light sensitive component 12.

With continued reference to FIG. 9, it can be seen that the light power received by the light sensitive component 12 initially increases in region B and then, after the illuminated circle 30 achieves a diameter equal to the light sensitive component 12, begins to decrease in region C. The present invention takes advantage of the characteristic shape of the curve illustrated in FIG. 9 to create a laser monitoring apparatus that compensates for changes in the angle of divergence which can be caused by changes in temperature during the operation of the laser.

Figure 10:
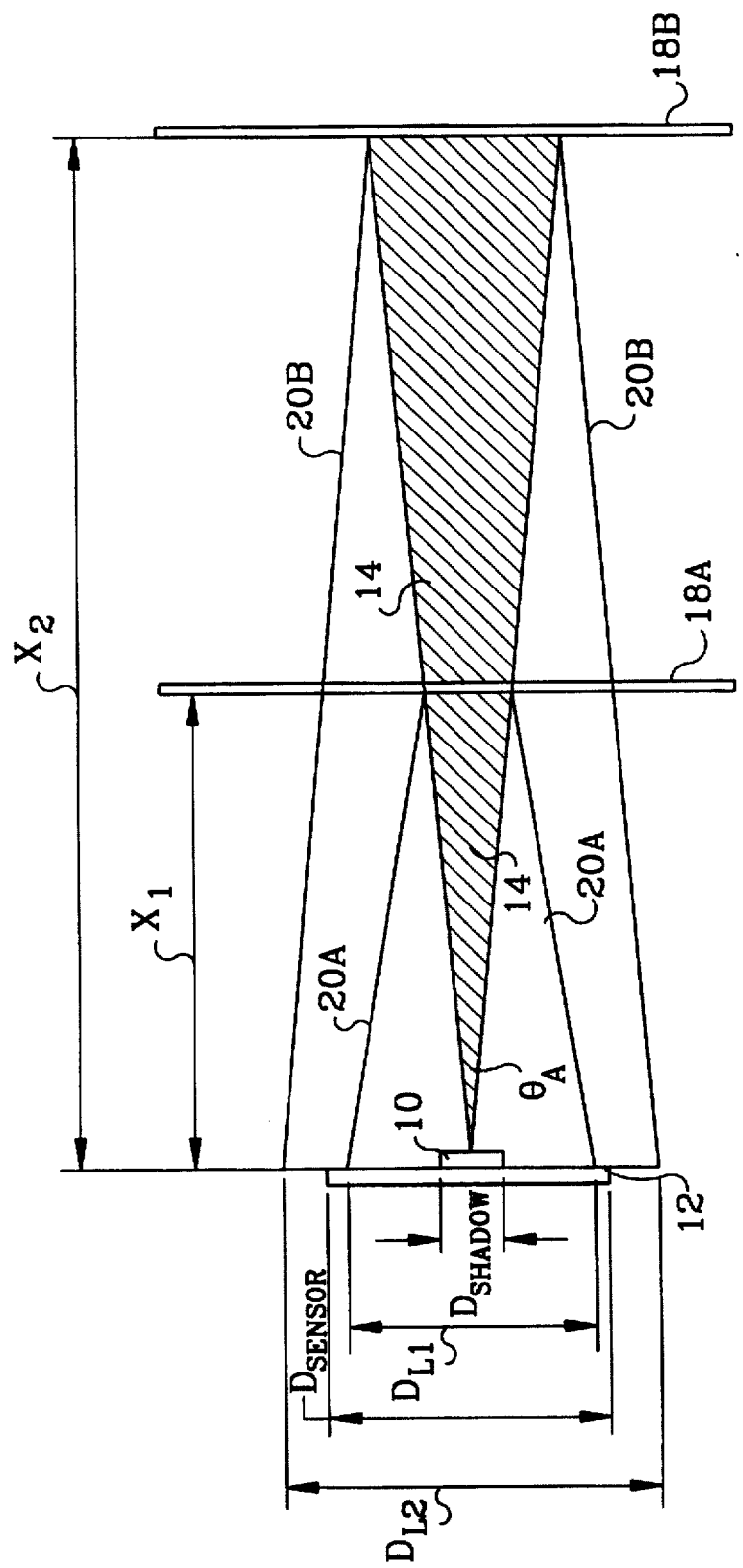
FIG. 10 illustrates an exemplary arrangement of first and second windows relative to a light sensitive component and a VCSEL.

FIG. 10 illustrates the basic principle of the present invention. It provides a first window 18A and a second window 18B that are spaced apart by a preselected distance. The first and second windows are positioned at locations which provide a first reflected beam 20A and a second reflected beam 20B, respectively, which result in a first illuminated circle with a diameter $D_{L1}$ and a second illuminated circle with a diameter $D_{L2}$. The first reflected beam 20A creates an illuminated circle with a diameter $D_{L1}$ which is greater than the diameter of the VCSEL 10, but less than the diameter of the light sensitive component 12. The second reflected light beam 20B creates an illuminated circle with a diameter $D_{L2}$ that is greater than the diameter of the light sensitive component 12. The conditions shown in FIG. 10 are intended to exist when the angle of divergence $\Theta_A$ is at its minimum expected magnitude. The precise sizes of the two illuminated circles resulting from the two reflected beams, 20A and 20B, are not limiting to the present invention as long as reflected light beam 20A creates an illuminated circle with a diameter $D_{L1}$ smaller than the outer diameter $D_{SENSOR}$ of the light sensitive component 12 and the second reflected light beam 20B creates an illuminated $D_{L2}$ circle that is greater than the diameter $D_{SENSOR}$ of the light sensitive component 12 when the angle of divergence, or the numerical aperture, is at a minimum expected magnitude.

With reference to FIGS. 9 and 10, it should be understood that both of the reflected light beams, 20A and 20B, will cause light energy to be imposed on the light sensitive component 12 in a relationship generally defined by the curve shown in FIG. 9. Each of these two reflected beams will behave in a characteristic manner as represented by the curve in FIG. 9, but with a different angular position along the horizontal axis in FIG. 9 of their respective curves and different maximum values of their respective curves. As will be described in greater detail below, the horizontal position of the curve will depend on the magnitude of the window's distance, $X_1$, or $X_2$, from the light sensitive component. In addition, the maximum height of the curve for a particular window will depend on its coefficient of reflectivity. If the coefficient of reflectivity for the two windows, 18A and 18B, are selected properly and in conformance with the distances of the two windows from the light sensitive component, the curves for the two windows will compensate each other and result in a generally constant sum of light energy imposed on the light sensitive component over a preselected range of angles of divergence. If the reflectivities of the windows and the distances of the windows from the light sensitive component are properly selected, the general constancy of the sum of light energies will extend over the entire expected operating range of numerical aperture expected for the VCSEL in normal operation.

Figure 11:
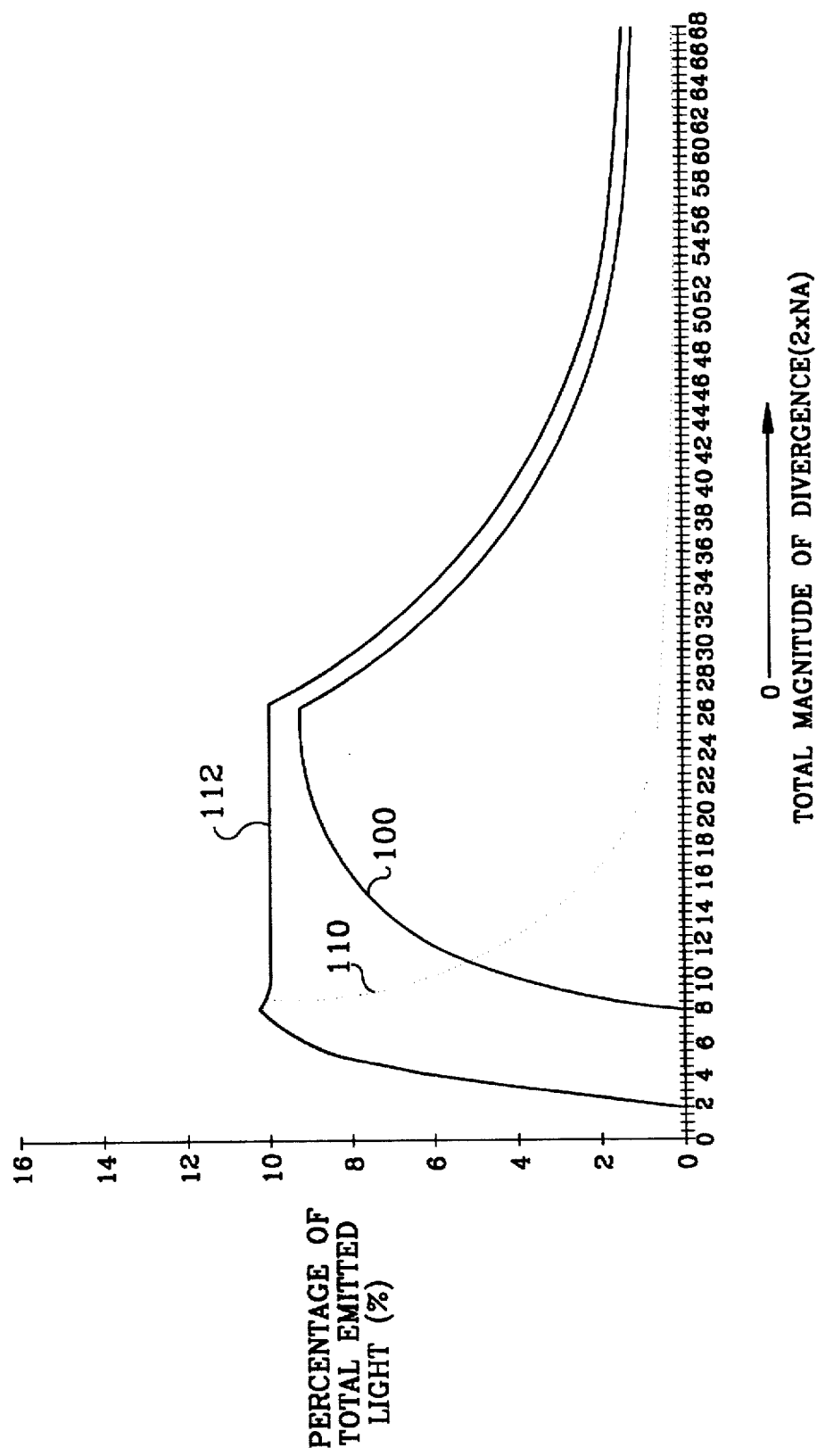

FIG. 11 is a graphical representation of one possible application of the present invention. If the two windows, 18A and 18B, in FIG. 10 are placed at 0.050 inches and 0.180 inches, respectively, from the light sensitive component 12 and the coefficient of reflection for the two windows, respectively, are 10 percent and 13.5 percent, the resulting light powers imposed on the light sensitive component will have characteristics represented in FIG. 11. Curve 100 represents the relationship between the percentage of total light reflected by the first window 18A as a function of the magnitude of divergence $\Theta_A$ in the arrangement represented in FIG. 10. Curve 110 in FIG. 11 represents the percentage of total light reflected by the second window 18B as a function of the magnitude of divergence. Curve 112 in FIG. 11 represents the sum of curves 100 and 110. Because of the positions of the two windows relative to the light sensitive component 12 and the coefficient of reflection of the two windows, curves 100 and 110 provide a region of curve 112 that is generally flat. This indicates that the percentage of total light reflected to the light sensitive component 12, as a percentage of the total light emitted by the VCSEL 10, is generally constant between approximately 8 degrees and 28 degrees of divergence of the light beam 14. If the angle of divergence is expected to remain within this range during normal operation, the two windows will provide a constant ratio between the light received by the light sensitive component 12 and the light emitted by the laser. This allows the light sensitive component 12 to be used to accurately monitor the output power emitted by the laser. It is independent of the angle of divergence, which is two times the numerical aperture NA, and provides a degree of independence from the difficulties otherwise caused by changes in temperature which can lead to changes in the numerical aperture NA.

In order to illustrate that the basic concept of the present invention is not limited to any particular set of coefficient of reflection for the windows or any particular set of positions of the two windows relative to the light sensitive component 12, FIG. 12 shows a different set of curves resulting from different choices with regard to the coefficient of reflection and the magnitudes of dimensions $X_1$ and $X_2$ in FIG. 10. Curve 120 represents the relationship of the light reflected back to the light sensitive component 12 by the first window 18A and curve 124 represents the relationship of the percentage of the total emitted light that is reflected back toward the light sensitive component 12 by the second window 18B. Both curves 120 and 124, are represented as functions of the total magnitude of divergence. Curve 128 represents the sum of curves 120 and 124. In FIG. 12, it can be seen that curve 128 is generally flat from approximately 19 degrees to approximately 28 degrees of divergence. If the circumstances relating to the laser indicate that this range of operation is appropriate, the two windows will provide a generally constant ratio between the light received by the light sensitive component 12 to the total light power emitted by the laser.

In the various examples described above, certain dimensions and characteristics for the individual elements of the present invention were assumed to allow the curves of FIGS. 11 and 12 to be generated. For example, the radius $R_{SENSOR}$ of the light sensitive component 12 was assumed to be 0.025 inches, the radius $R_{SHADOW}$ of the VCSEL 10 was assumed to be 0.007 inches and the total light energy emitted by the VCSEL was assumed to be 100 percent. In the example represented in FIG. 11, distance $X_1$ was 0.050 inches, distance $X_2$ was 0.180 inches, the coefficient of reflection of the first window 18A was 10 percent and the coefficient of reflection of the second window 18B was 13.5 percent. The curves in FIG. 12 were generated by assuming that distance $X_1$ was 0.050 inches and distance $X_2$ was 0.075 inches. The coefficient of reflection for the first window 18A was 4 percent and the coefficient of reflection for the second window 18B was approximately 1 percent.

It is helpful to understand the relationship between the coefficient of reflection for the two windows and the distances between the windows and the light sensitive component. Two variables can be determined from the type of information described above. Equation 5 shows a parameter N that is then used to determine the effective reflectivity $\alpha$ of the second window relative to the reflectivity of the first window. In equation 5, N is defined as the ratio of the quantity determined by subtracting the radius of the VCSEL squared from the radius of the light sensitive component squared to the quantity of the radius of the VCSEL squared. This provides the value for variable N which is used in equation 6 to determine the ratio of the coefficients of reflectivity for the two windows. For example, assuming the detector radius $R_{SENSOR}$ to be 0.025 inches, $R_{SHADOW}$ the VCSEL radius to be 0.007 inches, the magnitude of $X_1$ to be 0.050 inches and the magnitude of $X_2$ to be 0.180 inches, the resulting value of N is 11.7551 as a result of equation 5. This result, shown in equation 8 below is developed as shown in equations 5, 6 and 7.

$$N=(R_{SENSOR}^2-R_{SHADOW}^2)/R_{SHADOW}^2 \quad (5)$$

$$N=((0.025)^2-(0.007)^2)/(0.007)^2 \quad (6)$$

$$N=((0.000625)-(0.000049))/(0.000049) \quad (7)$$

$$N=11.7551 \quad (8)$$

As described above, the ratio of the coefficient of reflectivity of the second window 18B (including all transmission losses as the light passes through the first window, is reflected by the second window and again passes through the first window) to the coefficient of reflectivity of the first window can be calculated as a function of the squares of the two distances between the light sensitive component 12 and the first and second windows, 18A and 18B, and the value of N described above. Equation 9 shows this relationship. Using the magnitudes assumed for purposes of this description, equation 10 shows the calculated ratio of reflectivities $\alpha$.

$$\alpha=(X_2^2/X_1^2)(1/N) \quad (9)$$

$$\alpha=((0.180)^2/(0.050)^2)/(11.7551)=1.1025 \quad (10)$$

Since the light which is reflected by the second window must pass through the first window, it is diminished by a factor equal to $(1-C_1)$ as it passes from the laser toward the second window. Then, it is reflected according to the second window's coefficient of reflectivity $C_2$ back toward the laser. However, it must again pass through the first window and it is again affected by its coefficient of transmissivity by a factor of $(1-C_1)$. The total affect of these reflectivities is equal to the value $\alpha$ calculated in equation 10. This relationship is shown in equations 11 and 12.

$$(C_2(1-C_1)^2)/C_1=\alpha \quad (11)$$

$$(C_2(1-C_1)^2)/C_1=1.1025 \quad (12)$$

If a coefficient of reflectivity for the first window is assumed to be 10 percent, as shown in equation 13, the necessary coefficient of reflectivity $C_2$ for the second window can be determined by the relationships described above and illustrated in equations 5, 9 and 11. With an assumed coefficient of reflectivity $C_1$ for the first window of 10 percent, the coefficient of reflectivity $C_2$ for the second window can be calculated using the relationships shown in equations 14, 15, 16 and 17. Therefore, given the other assumptions made with regard to this exemplary determination, the above discussion illustrates that a coefficient of reflectivity of 10 percent and 13.611 percent for the first and second windows, respectively, are appropriate for two windows that are spaced apart from the light sensitive component 12 by distances of 0.050 inches and 0.180 inches, respectively. It should be understood that many different combinations of spacings and coefficients of reflectivity could be used in combination with each other, as illustrated by equations 1–17.

$$C_1=0.1=10\% \quad (13)$$

$$(C_2(1-0.1)^2)/0.1=1.1025 \quad (14)$$

$$(C_2(0.81))/0.1=1.1025 \quad (15)$$

$$8.1(C_2)=1.1025 \quad (16)$$

$$C_2=0.13611=13.611\% \quad (17)$$

The graphical representation discussed above in conjunction with FIG. 11 was created to show the results of two windows disposed apart by the magnitudes developed above and provided with coefficients of reflectivity similar to those specified in equations 13 and 17. The two windows provide light reflections, represented by curves 100 and 110, which are suitable for providing a combined light power reflection on the light sensitive component 12 that is constant during a relatively significant portion of the range of numerical apertures NA or magnitudes of divergence $\Theta$ expected during the operation of the VCSEL.

In summary, the monitoring of the output power of a VCSEL can be achieved by mounting the VCSEL near the center of a large area photodiode which has been specifically designed to have a contact pad in the center to allow electrical contact to be made to the underside of the VCSEL. Alternatively, the VCSEL and the photodiode can be provided as two elements of a single semiconductor substrate. Any reflection mechanism can be used to deflect some of the light back toward the VCSEL. For example, windows, diffractive elements or lens surfaces can be used for these purposes. The surface can have a glass/air interface or be partially metalized or coated as required to achieve the desired reflectivity. In order for a monitor to be used to control the bias point of a VCSEL, it is essential that the tracking ratio be constant over all conditions of bias, temperature and reflection over the laser's operating range. The tracking ratio is the ratio of detected power divided by transmitted power. In other words, it is the ratio of the light power received by a light sensitive component, or diode, divided by the total power emitted by the laser. If the reflector samples the VCSEL transmitted power uniformly, the tracking ratio should be acceptable and, consequently, the reflected power should maintain a fixed proportion to the transmitted power. However, the configuration mentioned above will necessarily block some of the reflected power from falling on the monitor because of the location of the VCSEL within the reflected light beam. The VCSEL will shadow some of the power in the center of the beam and, depending on the distance, the numerical aperture NA of the VCSEL and the detector diameter, it may be possible to overfill the detector and loose power at its edges. This causes the reflected power which is detected by the light sensitive component, or photodiode, to vary with the numerical aperture of the laser which is known to change with bias current and temperature. This change is sometimes quite dramatic and can vary, for example, between a numerical aperture of 0.07 and a numerical aperture of 0.11. The changes in the numerical aperture will cause corresponding changes in the tracking ratio of the device.

As described above, the present invention provides a scheme that allows the device to be desensitized to variations in the numerical aperture NA and compensated for the purpose of keeping the tracking ratio generally constant and enabling the device to be used as a monitor for a VCSEL. The basic principle of the present invention can be understood if one skilled in the art considers the effect of having two windows reflecting light back toward the light sensitive component. It is possible to find a distance for the nearest window where the light being reflected is partially reflected back onto the VCSEL and partially back onto the light sensitive component, or photodiode. One skilled in the art would expect an increase in the numerical aperture of the laser to cause a corresponding increase in the tracking ratio under these conditions. This would indicate denoting the variation in tracking ratio as a function of numerical aperture would exhibit a positive slope as identified as region B in FIG. 9. If a second window is placed at a greater distance from the light sensitive component 12, it could have the opposite characteristic in which an increase in the numerical aperture would create a net reduction in its tracking ratio as the light power reflected by the second window overfills the detector giving a negative slope to the tracking ratio with respect to the numerical aperture, as represented in FIG. 9 as region C. A combination of these two windows could then be used to cancel the change in tracking ratio as a function of numerical aperture, at least over a reasonable range of numerical apertures or magnitudes of divergence of the light beam emitted by the laser. One reflected beam would compensate the other and their sum would remain generally constant over the preselected range. In order to achieve exact compensation, it would be necessary to increase the reflectivity of the second window so that the exact level of compensating reflection can be added to the first level. These results have been simulated and empirically tested in a laboratory to determine the validity of the basic principle. The advantage of the present invention is that it allows one skilled in the art to compensate the tracking ratio when there is no other design flexibility regarding the position of the first window or other limitations.

The theory of the present invention has been explained above in conjunction with flat surfaces of the windows and the number of windows being two. However, more than two surfaces can be used to achieve a higher level of compensation. To implement a VCSEL monitor with more than two windows, the results shown in FIGS. 11 and 12 would be duplicated for three curves instead of two curves and the sum of the three curves would be used to represent the total added power reflected back onto the light sensitive component by the three windows. The goal of that embodiment of the present invention would be to achieve a flat region for the sum curve in a similar manner to that described above in conjunction with FIGS. 11 and 12. It should also be understood that windows with curved surfaces could be used in an alternative embodiment of the present invention. Of course, the curved surfaces would have to be carefully designed to provide a preselected geometry that achieves perfect compensation, but a simple spherical surface can achieve a reasonable good approximation of this condition. For example, these results have been empirically demonstrated by using a sapphire bead with a three millimeter diameter as the reflector. One skilled in the art will also realize that increased coefficients of reflectivity for the first and second windows also provide the added benefit of protecting the light sensitive component 12 from extraneous sources of light emitted in a direction through the windows and toward the light sensitive component.

Although a preferred embodiment of the present invention has been described in considerable detail and illustrated with particular specificity to show and explain one particular implementation of the present invention, if should be understood that many other embodiments are within its scope.

The embodiments of the invention in which an exclusive property or right is claimed are defined as follows:

1. A light source monitor, comprising:
a light source for providing a light beam;
a light sensitive component disposed proximate said light source;
a first window, which intersects an axis through said light source, said first window being partially reflective and partially transmissive and disposed to direct a first reflected light beam toward said light sensitive component, the amount of light energy of said first reflected light beam directed onto said light sensitive component by said first window being a function of a variable characteristic of said light beam; and
a second window, which intersects said axis, said second window being partially reflective and partially transmissive and disposed to direct a second reflected light beam toward said light sensitive component, the amount of light energy of said second reflected light beam directed onto said light sensitive component by said second window being a function of said variable characteristic of said light beam, said first and second windows being spaced apart by a predetermined distance, whereby a change in said variable characteristic of said light beam causes mutually compensating changes in said first and second reflected light beams to cause a sum of the light energies of said first and second reflected light beams to remain generally constant over a preselected range of said variable characteristic.

2. The monitor of claim 1, wherein:
said light source is a laser.

3. The monitor of claim 2, wherein:
said laser is a vertical cavity surface emitting laser.

4. The monitor of claim 3, wherein:
said light source is surrounded by said light sensitive component.

5. The monitor of claim 4, wherein:
said light sensitive component is a photodiode.

6. The monitor of claim 1, wherein:
said first and second windows are generally perpendicular to said axis.

7. The monitor of claim 1, wherein:
said first and second windows are generally parallel to each other.

8. The monitor of claim 1, wherein:
said variable characteristic is the magnitude of divergence of said light beam.

9. A light source monitor, comprising:
a light source for providing a light beam, which intersects an axis through said light source, said light source being a vertical cavity surface emitting laser;
a light sensitive component disposed proximate said light source;
a first window, which intersects said axis, said first window being partially reflective and partially transmissive and disposed to direct a first reflected light beam toward said light sensitive component, the amount of light energy of said first reflected light beam directed onto said light sensitive component by said first window being a function of a variable characteristic of said light beam; and
a second window, which intersects said axis, said first and second windows being generally parallel to each other, said second window being partially reflective and partially transmissive and disposed to direct a second reflected light beam toward said light sensitive component, the amount of light energy of said second reflected light beam directed onto said light sensitive component by said second window being a function of said variable characteristic of said light beam, said first and second windows being spaced apart by a predetermined distance, whereby a change in said variable characteristic of said light beam causes mutually compensating changes in said first and second reflected light beams to cause a sum of the light energies of said first and second reflected light beams to remain generally constant over a preselected range of said variable characteristic, said variable characteristic being the magnitude of divergence of said light beam.

10. The monitor of claim 9, wherein:

said light source is surrounded by said light sensitive component.

11. The monitor of claim 10, wherein:

said light sensitive component is a photodiode.

12. The monitor of claim 11, wherein:

said first and second windows are generally perpendicular to said axis.

13. A light source monitor, comprising:

a light source for providing a light beam, which intersects an axis through said light source, said light source being a vertical cavity surface emitting laser;

a light sensitive component disposed proximate said light source;

a first window, which intersects said axis, said first window being partially reflective and partially transmissive and disposed to direct a first reflected light beam toward said light sensitive component, the amount of light energy of said first reflected light beam directed onto said light sensitive component by said first window being a function of a variable characteristic of said light beam; and a second window, which intersects said axis, said first and second windows being generally parallel to each other, said second window being partially reflective and partially transmissive and disposed to direct a second reflected light beam toward said light sensitive component, the amount of light energy of said second reflected light beam directed onto said light sensitive component by said second window being a function of said variable characteristic of said light beam, said first and second windows being spaced apart by a predetermined distance, whereby a change in said variable characteristic of said light beam causes mutually compensating changes in said first and second reflected light beams to cause a sum of the light energies of said first and second reflected light beams to remain generally constant over a preselected range of said variable characteristic, said light source being surrounded by said light sensitive component, said light sensitive component being a photodiode, said first and second windows being generally perpendicular to said axis, said variable characteristic being the magnitude of divergence of said light beam.

* * * * *